(12) United States Patent
Anderson et al.

(10) Patent No.: US 6,661,100 B1
(45) Date of Patent: Dec. 9, 2003

(54) LOW IMPEDANCE POWER DISTRIBUTION STRUCTURE FOR A SEMICONDUCTOR CHIP PACKAGE

(75) Inventors: Brent A. Anderson, Jericho, VT (US); Randolph F. Knarr, Goldens Bridge, NY (US); Sarah H. Knickerbocker, Hopewell Junction, NY (US); Edmund J. Sprogis, Underhill, VT (US); Kamalesh K. Srivastava, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/210,631

(22) Filed: Jul. 30, 2002

(51) Int. Cl.[7] .......................... H01L 23/48; H01L 23/52
(52) U.S. Cl. ...................... 257/784; 257/778; 257/723; 257/777; 257/691
(58) Field of Search .................... 257/784, 778, 257/723, 777, 691

(56) References Cited

U.S. PATENT DOCUMENTS

| | | | |
|---|---|---|---|
| 5,222,014 A | | 6/1993 | Lin |
| 5,289,631 A | | 3/1994 | Koopman et al. |
| 5,869,894 A | * | 2/1999 | Degani et al. ............... 257/723 |
| 5,898,223 A | * | 4/1999 | Frye et al. ................... 257/777 |
| 6,057,598 A | * | 5/2000 | Payne et al. ................. 257/723 |
| 6,104,082 A | | 8/2000 | Berlin et al. |
| 6,133,626 A | | 10/2000 | Hawke et al. |
| 6,148,512 A | | 11/2000 | Brown |
| 6,181,569 B1 | * | 1/2001 | Chakravorty ................ 361/761 |
| 6,232,667 B1 | | 5/2001 | Hultmark et al. |
| 6,272,742 B1 | | 8/2001 | Armezzani et al. |
| 6,278,181 B1 | | 8/2001 | Maley |
| 6,407,459 B2 | * | 6/2002 | Kwon et al. ................. 257/780 |
| 6,455,408 B1 | * | 9/2002 | Hwang et al. ............... 438/613 |
| 6,501,169 B1 | * | 12/2002 | Aoki et al. .................. 257/700 |

* cited by examiner

Primary Examiner—Jasmine Clark
(74) Attorney, Agent, or Firm—Schmeiser, Olsen & Watts; Arthur J. Samodovitz

(57) ABSTRACT

A low impedance power distribution structure and method for substrate packaging of semiconductor chips containing very large scale integrated circuit (VLSI) circuits, such as microprocessors and associated memory, is presented. The power distribution structure incorporates under bump metallurgy (UBM) solder bump forming technology to produce not only solder bump connections that are vertically oriented, but also low impedance distribution wires that are horizontally oriented, and which provide electrical interconnection between various selected electrical contact points, such as solder bumps. These low impedance distribution wires introduce the benefits of low characteristic impedance to the substrate's power distribution structure.

20 Claims, 4 Drawing Sheets

LOW IMPEDANCE POWER DISTRIBUTION STRUCTURE FOR A SEMICONDUCTOR CHIP PACKAGE

BACKGROUND OF THE INVENTION

1. Technical Field

The invention relates generally to semiconductor packaging and chip design, and, more specifically, to a wire structure and construction method for stacked chip modules and packaging of semiconductor chips containing very large scale integrated circuit (VLSI) circuits, such as microprocessors and associated memory.

2. Related Art

Flip-chip module technology has facilitated increased system density and also increased operating frequency by reducing interconnection distances and increasing signal propagation speed. As chip operating frequencies and power dissipation requirements increase, it has become more difficult to make low impedance power supply connections to a chip or chips. Historically, Controlled Collapse Chip Connection (C4) flip-chip structures have had much better power distribution than wire bond designs, because the C4 chip carrier is typically designed with power supply planes in the chip carrier which can be connected to the chip in many places by C4 solder bumps (usually in a ball grid-array). Wire bonded chips are not as attractive for power distribution because they usually have just peripherally-located pads, and thus power must be distributed within the chip by only the internal chip wiring, which results in higher impedance and increased susceptibility to supply line noise.

Recently, stacked chip packages have begun to be used in industry since they allow for high bandwidth interconnects between multiple chips of potentially dissimilar technologies. The goal of moving to System-On-a-Chip (SoC) technologies may actually, in many cases, be less costly to implement as System-On-a-Package (SoP) technology. Flip-chip, or other stacked chip arrangements, offer the best high bandwidth chip-to-chip interconnects, but suffer from power distribution problems similar to the wire bond chip situation described above.

Accordingly, there exists a need in the industry for a low impedance power distribution structure, for use in flip-chip type stacked chip modules, which is capable of solving the above-mentioned problems resulting from high impedance wires in power distribution circuits.

SUMMARY OF THE INVENTION

It is therefore a feature of the present invention to overcome the above shortcomings related to flip-chip type stacked chip module power distribution structures, by providing a method and structure for a low impedance power distribution wire structure.

In a first general aspect, the present invention provides a wire structure made from an under bump metallurgy (UBM) process, said wire structure comprising: a substrate having a plurality of first features, said first features including under bump metallurgy; a plurality of second features situated over at least one of said first features, said second features operatively connected to said first features; at least one electrical wire interconnecting said plurality of first features, wherein said electrical wire includes under bump metallurgy, said electrical wire comprising a metal structure having a low impedance and characterized by having substantially the same composition as the contact pads; and wherein said first features and said electrical wire are formed in substantially the same plane.

In a second general aspect, the present invention provides an electronic package comprising: a first substrate having a first surface, said first surface including a plurality of first features; a second substrate having a second surface, said second surface including a plurality of second features, wherein said second substrate is positioned substantially parallel to said first substrate, and wherein said second surface is located proximal to and facing said first surface; first electrical wires located on said first surface, said first electrical wires connecting selected ones of said plurality of first features on said first surface; second electrical wires located on said second surface, said second electrical wires connecting selected ones of said second plurality of second features on said second surface; wherein said first substrate and said second substrate are operationally bonded together; and said first electrical wires, said second electrical wires, said first features and said second features are formed with under bump metallurgy (UBM) processing.

In a third general aspect, the present invention provides a method of forming an electronic package comprising: providing a first substrate having a first surface, said first surface including a plurality of first features; providing a second substrate having a second surface, said second surface including a plurality of second features, wherein said second substrate is positioned substantially parallel to said first substrate, and wherein said second surface is located proximal to and facing said first surface; providing first electrical wires located on said first surface, said first electrical wires connecting selected ones of said plurality of first features on said first surface; providing second electrical wires located on said second surface, said second electrical wires connecting selected ones of said plurality of second features on said second surface; wherein said first substrate and said second substrate are operationally bonded together; and forming said first electrical wires, said second electrical wires, said first features, and said second features with under bump metallurgy (UBM) processing.

The foregoing and other features and advantages of the invention will be apparent from the following more particular description of embodiments of the invention. It is to be understood that both the foregoing general description and the following detailed description are exemplary, but are not restrictive, of the invention.

BRIEF DESCRIPTION OF THE DRAWINGS

The features and inventive aspects of the present invention will become more apparent upon reading the following detailed description, claims and drawings, of which the following is a brief description.

DETAILED DESCRIPTION OF THE EMBODIMENTS

The following is a detailed explanation of the structure and method for a low impedance power distribution structure for a flip-chip type stacked chip module, and an electronic package resulting from manufacturing using embodiments of the present invention, with reference to the attached drawings. It should be noted that the same reference numbers are assigned to components having approximately the same functions and structural features in the following explanation and the attached drawings to preclude the necessity for repeated explanation thereof.

According to the present invention, a solder bump forming process is utilized to form not only solder bumps, or rounded solder balls, that make chip-to-chip connections, i.e., vertical connections, but also to use the solder bump forming process to make solder lines, i.e., electrical wires, which can provide interconnections between select solder bumps or other contact pads on the same substrate surface, i.e., horizontal connections. These electrical wires serve as very low impedance busses (ie., having sheet rho values of less than a few milli-ohms, depending on line thickness) to supply power from the outer edge contacts for the bottom chip in a stack. The electrical wires further provide improved heat dissipation for the chip, since the electrical wires function as heta sinks for thermal conduction of heat from the chip to the surrounding environment.

A typical solder bump forming process utilizes a first masking step to produce a "seed" layer, called the "under bump metallurgy" (UBM) layer. During a typical solder reflow step, the UBM layer prevents diffusion of solder into the underlying chip metallization layers, or so-called barrier corrosion protection. The UBM layer is also used to ensure that there exists good adhesion between the chip metallization layers, and also that there is low contact resistance in the chip metallization layers.

In the method of the present invention, the UBM layer is used to not only provide the aforementioned segregation of metals, but is also used to create stand-alone wires. The structure of the present invention includes a UBM layer and solder bump structure wherein the UBM layer consists not only of interconnecting paths, but also of wires. As disclosed herein, known solder bump and UBM processes are used to form a plurality of wires which act as low impedance busses to distribute power within the chip package. These wires or busses may be formed to any desired shape, such as, inter alia, rectilinear wires, curvilinear wires, or various combinations of both.

Figure 1:
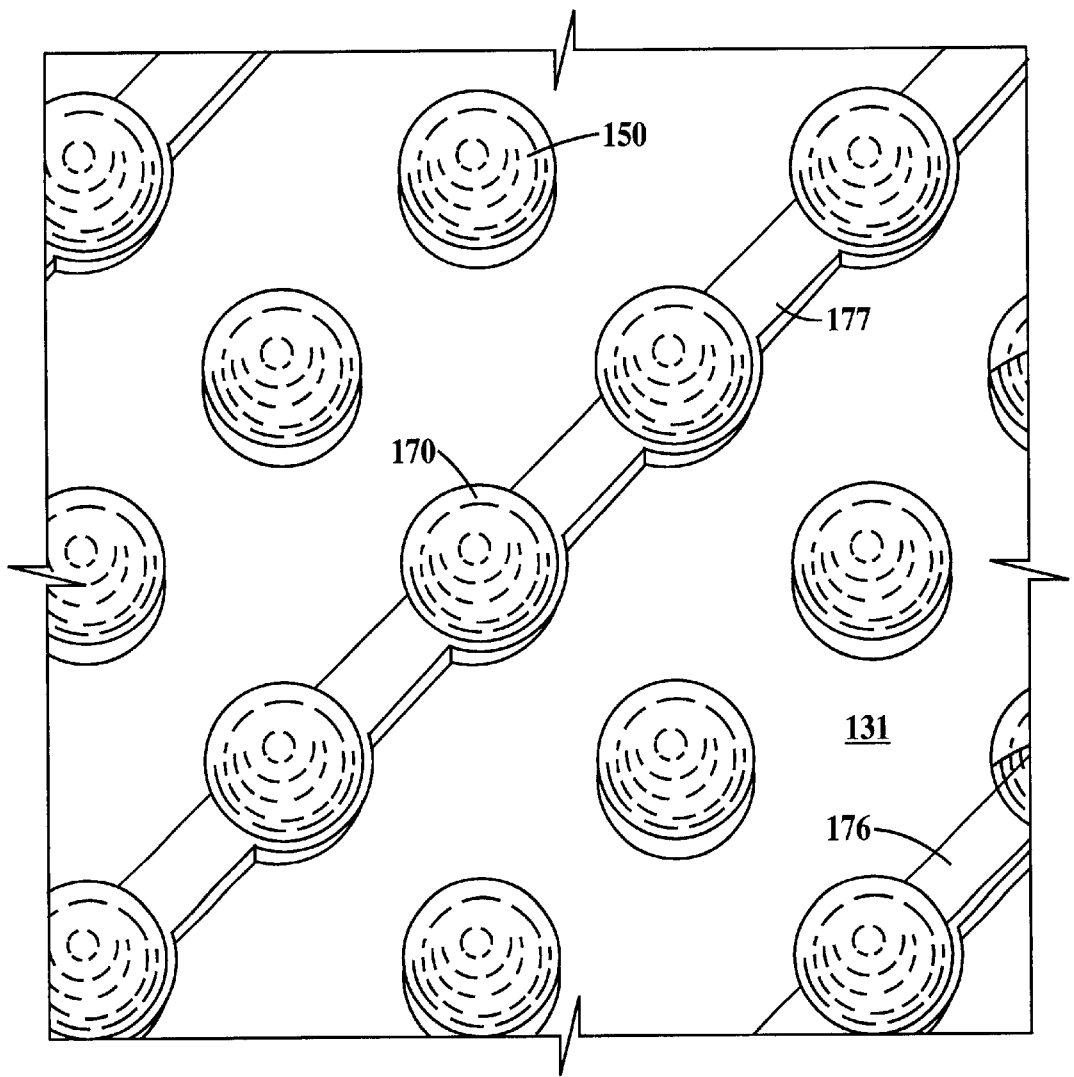
FIG. 1 is a perspective view of the surface of a substrate showing a portion of a solder bump grid array modified in accordance with an embodiment of the present invention.

FIG. 1 is a perspective view of the surface 131 of a substrate 100 showing a portion of a solder bump grid array modified in accordance with an embodiment of the present invention. Solder bumps 150 are typical interchip connections, while a plurality of solder bumps 170 are connected by a first low impedance distribution wire 177. A second low impedance distribution wire 176 is also shown.

While a typical chip wire is on the order of about 1 micron tall, typical dimensions for a low impedance distribution wire 177 of the present invention can be about 10 to 150 microns, or more, wide, with a thickness of about 1 to 50 microns, or more. These dimensions illustrate why the low impedance distribution wires of the present invention have a much lower characteristic impedance as compared to the typical known chip wires.

Figure 2:
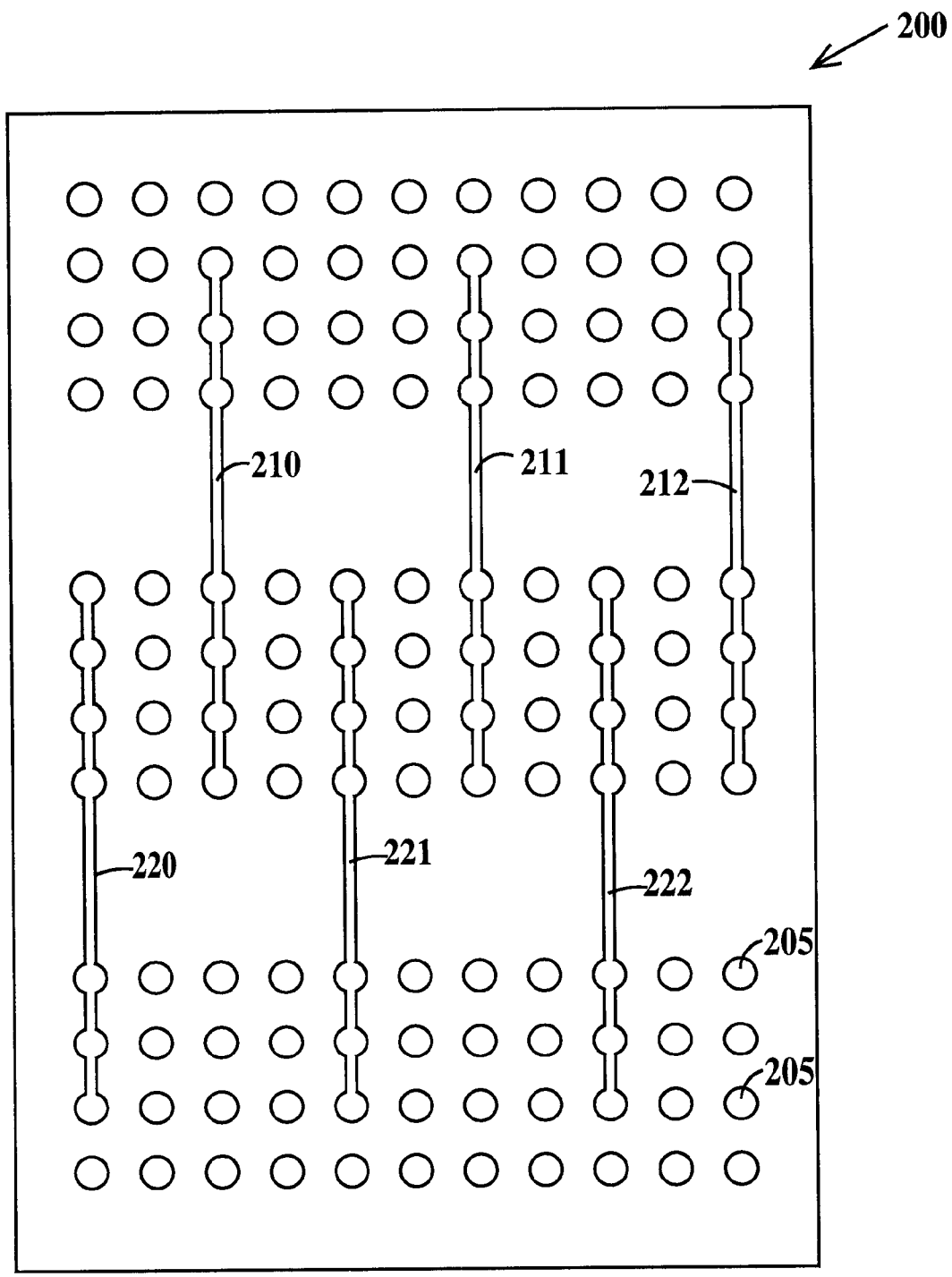
FIG. 2 is a plan view of a bottom chip plated solder pattern in accordance with an embodiment of the present invention.

Referring now to FIG. 2, a plan view of a bottom chip 200 having a power distribution structure formed from a solder pattern in accordance with an embodiment of the present invention is illustrated. Bottom chip 200 contains a plurality of solder bump connections 205 arranged in a grid array pattern. A first group of solder bumps is connected with low impedance distribution wire 220 to create a power distribution structure having a first voltage potential, such as, inter alia, GND potential. As illustrated in FIG. 2, two additional GND busses 221, 222 are similarly formed.

As further illustrated in FIG. 2, a second set of low impedance distribution wires 210, 211, 212 can be formed. This second set of low impedance distribution wires 210, 211, 212 can be used as a power distribution structure having a second voltage potential, such as, inter alia, VDD.

The power distribution structures depicted in FIG. 2 are intended to be exemplary in nature, and are not meant to be taken as limiting. Other configurations for the power distribution structure are possible, and in fact may be better suited for minimizing undesirable impedance characteristics. For example, a power distribution structure utilizing low impedance busses could be formed in which the busses are arranged so that they criss-cross one another in a three-dimensional lattice arrangement.

Figure 3A:
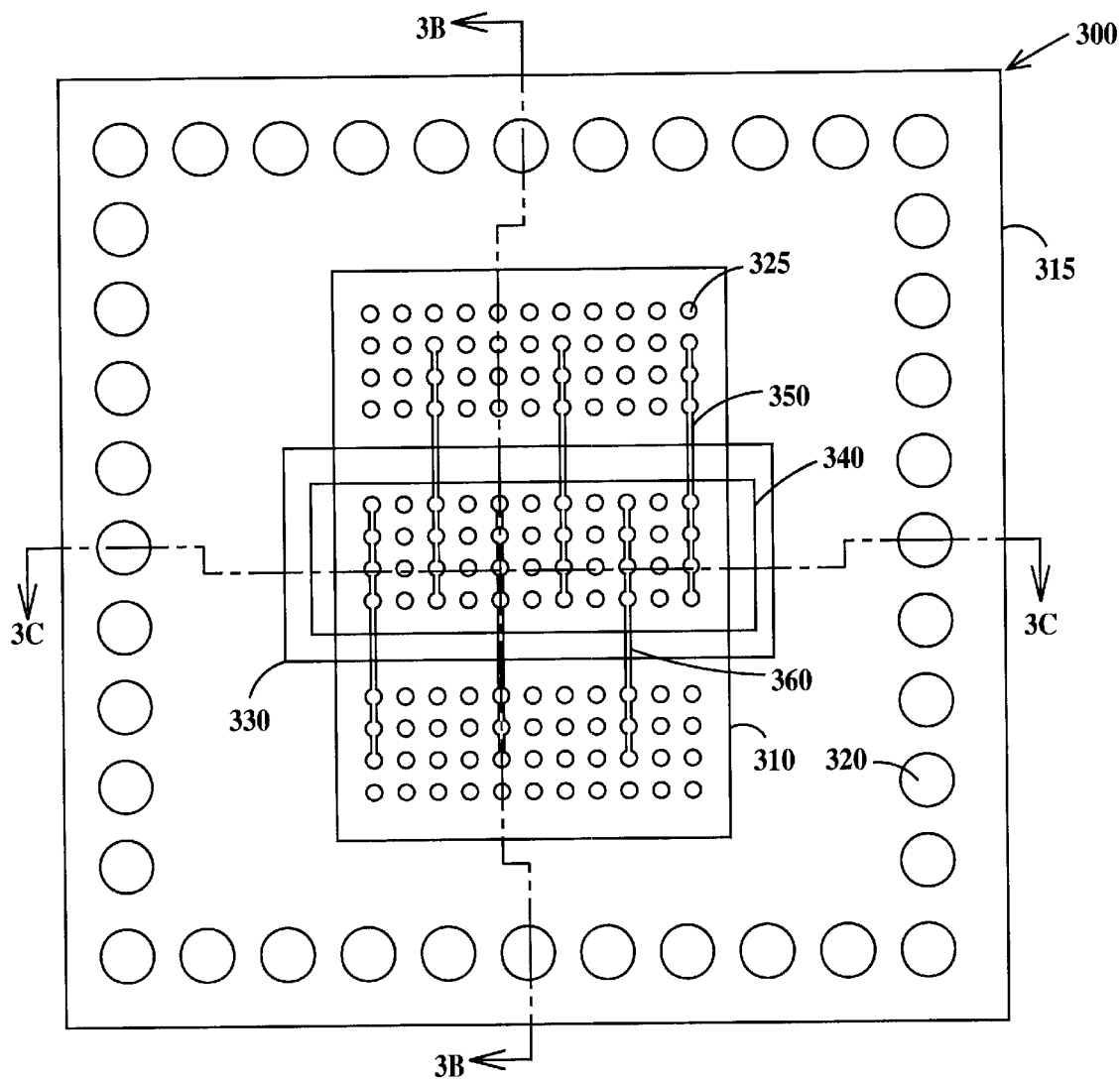
FIG. 3A is a plan view of a possible module configuration in accordance with an embodiment of the present invention.
Figure 3B:
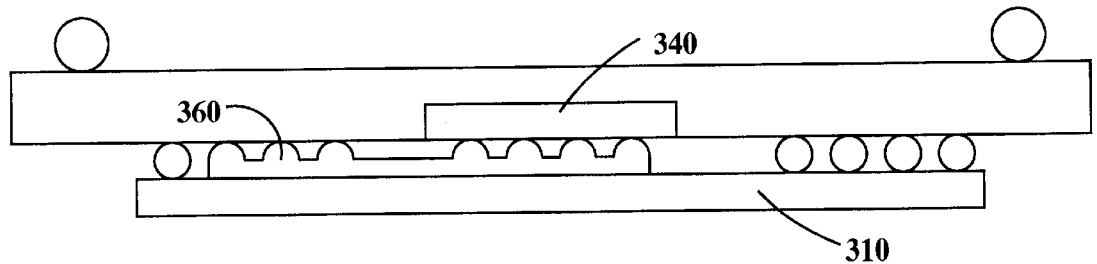
FIG. 3B is a cross-sectional view of the module configuration of FIG. 3A taken at sectional line B—B.
Figure 3C:
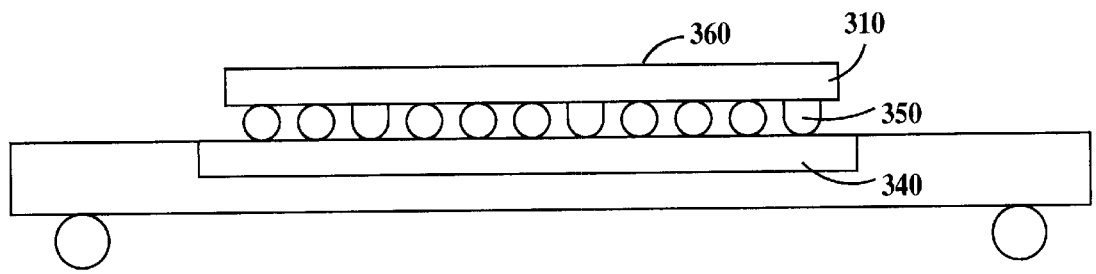
FIG. 3C is a cross-sectional view of the module configuration of FIG. 3A taken at sectional line C—C.

FIG. 3A is a plan view of a possible module configuration in accordance with an embodiment of the present invention. FIG. 3B is a related cross-sectional view of the module configuration of FIG. 3A taken at sectional line B—B. FIG. 3C is also a related cross-sectional view of the module configuration of FIG. 3A taken along sectional line C—C.

In FIG. 3A, module 300 includes a chip carrier 315 which has, located around its periphery, a plurality of wire bond connections 320. Chip carrier 315 further includes an opening 330, which is typically located about the center region of chip carrier 315. Opening 330 may be any appropriate shape and size, but is typically rectangular, and sized to accommodate a slave chip. Master chip 310 is emplaced on chip carrier 315, and appropriate electrical connections are made between chip carrier 315 and master chip 310 through solder bumps 325. Master chip 310 is also operationally connected to smaller slave chip 340 through a plurality of solder bumps. Slave chip 340 contacts master chip 310 through opening 330 in chip carrier 315. Low impedance distribution wires for GND potentials 360 and VDD potentials 350 are formed among solder bumps 325 on master chip 310.

The assembly of module 300, including chips which incorporate low impedance distribution wires of the present invention, may be accomplished using known techniques. For example, the larger or master chip 310 is joined to chip carrier 315 using a conventional solder construction, such as, inter alia, high-melt (i.e., 97/3) solder. In some applications, it may be beneficial to perform quality control testing such as, inter alia, chip testing or burn-in, at this point in the assembly process. The smaller or slave chip 340 is then joined to the master chip 310 by placing it through the opening 330 in chip carrier 315. The slave chip solder type could be a low-melt solder, a high-melt (i.e., 97/3) solder, or a tin cap. The use of low-melt solders on the master chip 310 can make the bond and assembly procedure very simple because of the solder hierarchy (i.e., the order in which various solders are employed) design.

Figure 4:
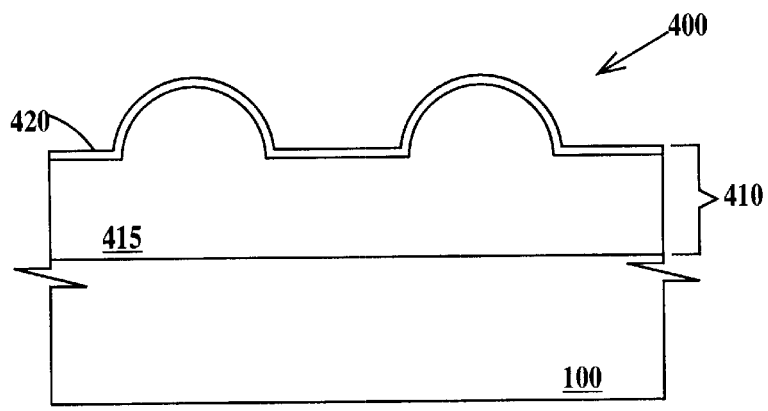
FIG. 4 is a cross-sectional view of an electrical wire in accordance with an alternative embodiment of the present invention.

FIG. 4 shows an alternative embodiment of an electrical wire of the present invention. The electrical wire embodiment 400 represents a modified UBM electrical wire 410 on substrate 100, and further includes a first UBM layer 415 and a second or capping layer 420 which is deposited upon first UBM layer 415. Capping layer 420, as a second portion of UBM electrical wire 410, is suitable for both the standard purposes of UBM, and also for use as wires that carry current laterally across the face of a chip, represented in FIG. 4 by substrate 100. Capping layer 420 may be formed with any suitable conductive metal or combination of metals, such as, inter alia, nickel, copper, or gold. Capping layer 420 may have from about sub-micron thickness to a thickness of many microns.

Embodiments of the present invention have been disclosed. A person of ordinary skill in the art would realize, however, that certain modifications would come within the teachings of this invention. For example, rather than the two chip (master and slave) embodiment as discussed herein, the present invention also encompasses embodiments wherein there are several slave chips for one master chip, or more than two layers of chips, etc. Therefore, the following claims should be studied to determine the true scope and content of the invention.

What is claimed is:

1. A wire structure made from an under bump metallurgy (UTBM) process, said wire structure comprising:
   a substrate having a plurality of first features, wherein, said first features are under bump metallurgy;
   a plurality of second features situated over at least one of said first features, said second features operatively connected to said first features;
   at least one electrical wire interconnecting said plurality of first features, wherein said electrical wire is under bump metallurgy, said electrical wire comprising a metal structure having a low impedance and characterized by having substatiantially the same composition as the first features; and
   wherein said first features and said electrical wire are formed in substantially the same plane.

2. The wire structure of claim 1, said electrical wire further comprising a modified under bump metallurgy, said modified tinder bump metallurgy including a capping layer, said capping layer disposed on the surface of the electrical wire.

3. The wire structure of claim 1, wherein said first features are solder bumps, said solder bumps being formed with UBM processing.

4. The wire structure of claim 1, wherein said electrical wire is used for power distribution.

5. The wire structure of claim 1, wherein said electrical wires are about 10 to about 150 microns wide, and wherein said electrical wires are about 1 to about 50 microns tall.

6. An electronic package comprising:
   a first substrate having a first surface, said first surface including a plurality of first features;
   a second substrate having a second surface, said second surface including a plurality of second features, wherein said second substrate is positioned substantially parallel to said first substrate, and wherein said second surface is located proximal to and facing said first surface;
   first electrical wires located on said first surface, said first electrical wires connecting selected ones of said plurality of first features on said first surface, wherein said first features and said first electrical wires are formed in substantially the same first plane;
   second electrical wires located on said second surface, said second electrical wires connecting selected ones of said second plurality of second features on said second surface, wherein said second features and said second electrical wires are formed in substantially the same second plane;
   wherein said first substrate and said second substrate are operationally bonded together; and
   wherein said first electrical wires, said second electrical wires, and said first features are under bump metallurgy (UBM).

7. The electronic package of claim 6, wherein selected ones of said first electrical wires, said second electrical wires, and said first features further comprise a modified under bump metallurgy, said modified under bump metallurgy including a capping layer, said capping layer disposed on the surface of selected ones of the first electrical wires, the second electrical wires, and the first features.

8. The electronic package of claim 6, wherein said first features are solder bumps.

9. The electronic package of claim 6, wherein at least one of said first substrate and said second substrate comprises a semiconductor chip.

10. The electronic package of claim 6, wherein said electronic package comprises a flip-chip package.

11. The electronic package of claim 6, wherein said plurality of electrical wires are selected from the group consisting of rectilinear wires, curvilinear wires, and a combination of rectilinear and curvilinear wires.

12. The electronic package of claim 6, wherein said first electrical wires and said second electrical wires are power distribution wires.

13. The electronic package of claim 6, wherein said first substrate and said second substrate are a master chip and a slave clip, respectively.

14. A method of forming an electronic package comprising:
   providing a first substrate having a first surface, said first surface including a plurality of first features;
   providing a second substrate having a second surface, said second surface including a plurality of second features, wherein said second substrate is positioned substantially parallel to said first substrate, and wherein said second surface is located proximal to and facing said first surface;
   providing first electrical wires located on said first surface, said first electrical wires connecting selected ones of said plurality of first features on said first surface, wherein said first features and said first electrical wires are formed in substantially the same first plane;
   providing second electrical wires located on said second surface, said second electrical wires connecting selected ones of said plurality of second features on said second surface, wherein said second features and said second electrical wires are formed in substantially the same second plane;
   wherein said first substrate and said second substrate are operationally bonded together; and
   forming said first electrical wires, said second electrical wires, said first features, and said second features with under bump metallurgy (UBM) processing.

15. The method of claim 14, wherein said step, of forming said first electrical wires, said second electrical wires, said first features, and said second features with under bump metallurgy (UBM) processing, further includes the step of forming a capping layer on at least one of said first electrical wires, said second electrical wires, said first features, and said second features.

16. The method of forming an electronic package of claim 14, wherein said first features are solder bumps.

17. The method of forming an electronic package of claim 14, wherein at least one of said first substrate and said second substrate comprises a semiconductor chip.

18. The method of forming an electronic package of claim 14, wherein said electronic package comprises a flip-chip package.

19. The method of forming an electronic package of claim 14, wherein said plurality of electrical wires are selected from the group consisting of rectilinear wires, curvilinear wires, and a combination of rectilinear and curvilinear wires.

20. The method of forming an electronic package of claim 14, wherein said first electrical wires and said second electrical wires are power distribution wires.

* * * * *